(12) United States Patent
Iwamiya et al.

(10) Patent No.: US 7,299,015 B2
(45) Date of Patent: Nov. 20, 2007

(54) TRANSMISSION OUTPUT CONTROL CIRCUIT, AND WIRELESS DEVICE USING THE SAME

(75) Inventors: Hiroki Iwamiya, Osaka (JP); Yuji Osumi, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 118 days.

(21) Appl. No.: 10/555,463

(22) PCT Filed: May 18, 2005

(86) PCT No.: PCT/JP2005/009047

§ 371 (c)(1),
(2), (4) Date: Nov. 2, 2005

(87) PCT Pub. No.: WO2005/117274

PCT Pub. Date: Dec. 8, 2005

(65) Prior Publication Data

US 2006/0240788 A1    Oct. 26, 2006

(30) Foreign Application Priority Data

May 27, 2004    (JP) ............................. 2004-157390

(51) Int. Cl.
*H04B 1/04* (2006.01)
*H04Q 11/12* (2006.01)
*H03G 3/00* (2006.01)

(52) U.S. Cl. ................. 455/127.1; 455/115.3; 455/522; 330/282

(58) Field of Classification Search ................. 455/91, 455/127.1, 69, 115.1, 115.3, 126, 127.2, 522; 330/129, 135, 279, 282, 284, 285

See application file for complete search history.

(56) References Cited

U.S. PATENT DOCUMENTS 4,392,245 A * 7/1983 Mitama ................... 455/115.1

(Continued)

FOREIGN PATENT DOCUMENTS

JP    4-316205 A    11/1992
JP    7-212256 A    8/1995

(Continued)

OTHER PUBLICATIONS

Japanese language International Search Report for PCT/JP2005/009047, dated Aug. 9, 2005.

*Primary Examiner*—Quochien B. Vuong
(74) *Attorney, Agent, or Firm*—RatnerPrestia

(57) ABSTRACT

According to a transmitting output control circuit, one end of a coupling capacitor and one end of main line of a directional coupler are coupled with an output terminal of a power amplifier. A switch for coupling the other end of the coupling capacitor and one end of a sub line of the directional coupler with an anode of a first diode or a second terminating resistor is formed in a power amplifying apparatus. Any one of the coupling capacitor and the directional coupler is coupled by switching the switch. By using this structure, the stable transmitting power control circuit, which can be used in a wide dynamic range necessary for detecting a transmitting output signal level, can be provided.

11 Claims, 7 Drawing Sheets

U.S. PATENT DOCUMENTS

| | | | |
|---|---|---|---|
| 5,109,538 A * | 4/1992 | Ikonen et al. | 455/127.2 |
| 5,392,464 A * | 2/1995 | Pakonen | 455/115.1 |
| 5,428,521 A * | 6/1995 | Kigawa et al. | 363/22 |
| 5,656,972 A * | 8/1997 | Norimatsu | 330/129 |
| 5,956,627 A * | 9/1999 | Goos | 455/127.1 |
| 6,301,486 B1 * | 10/2001 | Tanaka | 455/522 |
| 6,370,358 B2 * | 4/2002 | Liimatainen | 455/67.11 |
| 6,642,784 B2 * | 11/2003 | McMorrow | 330/129 |
| 2004/0090267 A1 * | 5/2004 | Nagamori et al. | 330/133 |
| 2004/0212435 A1 * | 10/2004 | Arai et al. | 330/285 |
| 2005/0116788 A1 * | 6/2005 | Matters-Kammerer et al. | 333/116 |

FOREIGN PATENT DOCUMENTS

| | | |
|---|---|---|
| JP | 11-289261 A | 10/1999 |
| JP | 2002-100937 A | 4/2002 |
| JP | 2002-100938 A | 4/2002 |
| JP | 2002-252564 A | 9/2002 |
| JP | 2001-140633 A | 5/2004 |

* cited by examiner

TRANSMISSION OUTPUT CONTROL CIRCUIT, AND WIRELESS DEVICE USING THE SAME

This application is a U.S. National Phase Application of PCT International Application PCT/JP2005/009047.

TECHNICAL FIELD

The present invention relates to an information communication device in an information communication field and more particularly to a transmitting output control circuit for controlling a transmitting signal emitted from an antenna, and a wireless device using the same.

BACKGROUND ART

FIG. 10 is a block diagram showing a conventional transmitting output control circuit. Power amplifying apparatus 2 used in this transmitting output control circuit 1 includes diode 5 of detector 4a and coupling capacitor 6 besides power amplifier 3.

When a dynamic range necessary for detecting a transmitting output signal level is small, detector 4a can be formed of diode 5 built in power amplifying apparatus 2, load resistor 8 used for outside smoothing circuit 7 and smoothing capacitor 9. On the other hand, when the dynamic range necessary for detecting the transmitting output signal level is large, an output level of power amplifying apparatus 2 is detected by keeping isolation of signal output terminal 18 from amplifier output terminal 11 enough using directional coupler 10, detector 4b and first terminating resistor 14 at the outside of power amplifying apparatus 2.

For example, Unexamined Japanese Patent Publication No. H7-212256 is known as a prior art reference of the present invention.

According to transmitting output control circuit 1 having a conventional structure mentioned above, when the dynamic range necessary for detecting the transmitting output signal level is large, diode 5 which has been made into IC can not be used. Therefore, another detector 4b is needed at the outside of power amplifying apparatus 2 too, so that downsizing of the circuit is difficult.

SUMMARY OF THE INVENTION

An object of the present invention is to provide a stable transmitting output control circuit, which can be used in a wide dynamic range necessary for detecting a transmitting output signal level, by using a diode built in a power amplifying apparatus as a detector.

To achieve the object mentioned above, the transmitting output control circuit of the present invention is formed of:
a power amplifying apparatus including:
  a power amplifier;
  a coupling capacitor for taking a part of a transmitting output signal of the power amplifier; and
  a first diode for inputting a signal corresponding to an output signal amplified by the power amplifier and generating a detecting signal;
a directional coupler;
a first terminating resistor coupled with one end of a sub line of the directional coupler;
a second terminating resistor; and
A smoothing circuit coupled with a cathode of the first diode.

In addition, one end of the coupling capacitor and one end of a main line of the directional coupler are coupled with an output terminal of the power amplifier. Furthermore, at the other end of the coupling capacitor and the other end of the sub line of the directional coupler, a switch for coupling an anode of the first diode or the second terminating resistor is formed in the power amplifying apparatus. Therefore, the part of the transmitting output signal of the power amplifier is taken through any one of the coupling capacitor and the directional coupler by switching of the switch.

In a word, by the detector using the diode which has been made into IC, when a dynamic range necessary for detecting the transmitting output signal level is small, the part of the transmitting output signal is taken by using the coupling capacitor. On the other hand, when a dynamic range is large, the part of the transmitting output signal whose isolation is kept enough can be taken stably by using the directional coupler. As a result, the transmitting output control circuit of the present invention can be used in a wide dynamic range. In addition, because the number of detectors for using can be reduced, the transmitting output control circuit can be downsized.

REFERENCE MARKS IN THE DRAWINGS

| | |
|---|---|
| 19 | transmitting output control circuit |
| 20 | power amplifying apparatus |
| 21 | power amplifier |
| 22 | detector |
| 23 | first diode |

-continued

| | |
|---|---|
| 24 | coupling capacitor |
| 25 | smoothing circuit |
| 26 | load resistor |
| 27 | smoothing capacitor |
| 28 | directional coupler |
| 29 | amplifier output terminal |
| 30 | main line |
| 31 | sub line |
| 32 | first terminating resistor |
| 33 | switch |
| 34a, 34b, 34c, 34d | terminal |
| 35 | second terminating resistor |
| 36 | detecting output terminal |
| 37 | signal input terminal |
| 38 | DC bias terminal |
| 39 | signal output terminal |
| 40 | multilayer board |
| 41 | surface layer |
| 42 | dielectric layer |
| 43 | capacitor electrode |
| 44 | ground electrode |
| 45a, 45b, 45c | via hole |
| 49 | temperature compensating circuit |
| 50 | base bias terminal |
| 51 | second diode |
| 52 | bipolar transistor |
| 53 | MOSFET |

DETAILED DESCRIPTION OF THE PREFERRED EMBODIMENTS

First Exemplary Embodiment

The first exemplary embodiment of the present invention is demonstrated hereinafter with reference to the accompanying drawings.

Figure 1:
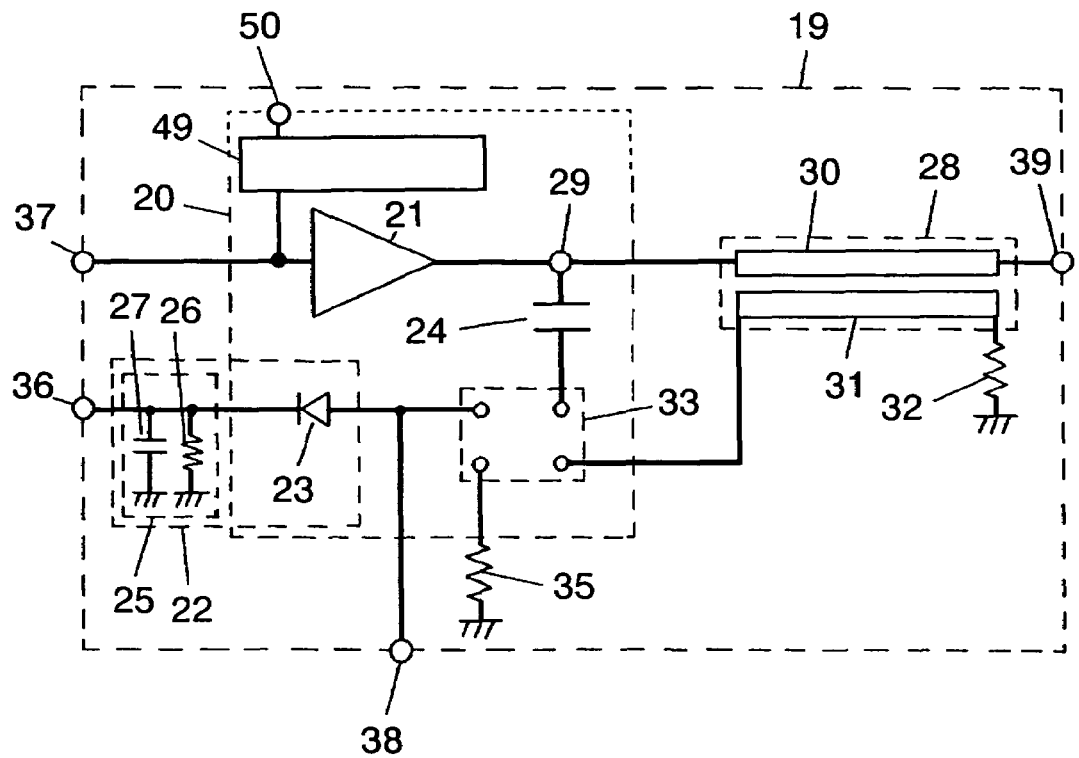
FIG. 1 is a block diagram showing a transmitting output control circuit in accordance with a first exemplary embodiment of the present invention.

FIG. 1 is a block diagram showing a transmitting output control circuit of the present invention. As shown in FIG. 1, power amplifying apparatus 20 used in transmitting output control circuit 19 includes first diode 23 used in detector 22 and coupling capacitor 24 besides power amplifier 21. For example, in a case where a signal level, which is input into signal input terminal 37 of transmitting output control circuit 19, is controlled so as to be kept substantially constant, a level of an output signal output from amplifier output terminal 29 of power amplifier 21 is also substantially constant (approximately 15 dBm). Therefore, even when dynamic range necessary for detecting is small (e.g., 10 dB), it is available. In this case, a part of the transmitting output signal level is taken from coupling capacitor 24 coupled with amplifier output terminal 29.

On the other hand, in a case where a signal level, which is input into signal input terminal 37 of transmitting output control circuit 19, is controlled so as not to be interfered in a neighbor channel used in another device, dynamic range necessary for detecting has to be large (e.g., 35 dB). Therefore, even a low signal level of approximately –20 dBm has to be detected. In a case where such a low signal level is detected, when the part of the transmitting output signal level is taken by using coupling capacitor 24, the transmitting output signal does not have a directional property. Therefore, an impedance with respect to the taken signal tends to be fluctuate because of a load connected to amplifier output terminal 29 of power amplifier 21.

Accordingly, one end of main line 30 of directional coupler 28 is coupled with amplifier output terminal 29 of power amplifying apparatus 20, and the other end thereof is coupled with signal output terminal 39. Furthermore, one end of sub line 31 of directional coupler 28 is coupled with one end of first terminating resistor 32. Using the structure discussed above, isolation of amplifier output terminal 29 with respect to signal output terminal 39 can be kept enough. As a result, the transmitting output signal level becomes stable because it is not influenced by fluctuation of a load connected to signal output terminal 39.

By forming switch 33 at power amplifying apparatus 20, the part of the transmitting output signal level taken from coupling capacitor 24 or the part of the transmitting output signal level taken from directional coupler 28 can be selected based on a scale of dynamic range necessary for detecting.

Figure 2:
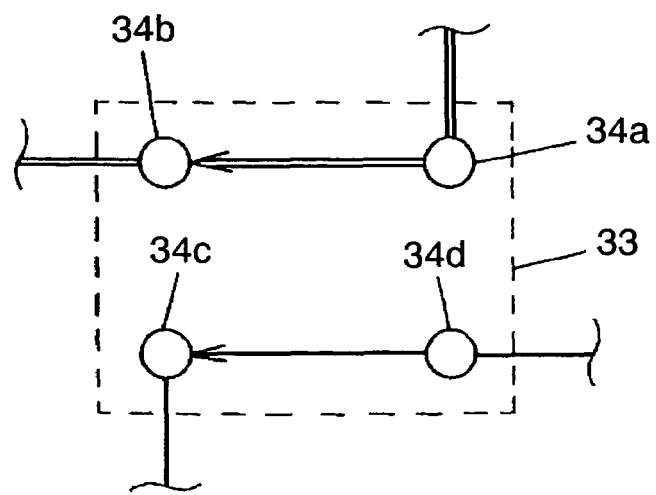
FIG. 2 shows a coupling state of a switch formed in a power amplifying apparatus in accordance with the first exemplary embodiment of the present invention.

FIG. 2 shows a coupling state of switch 33 in a case where the dynamic range of the signal is small. In FIG. 2, terminal 34a is coupled with terminal 34b, and terminal 34d is coupled with terminal 34c in switch 33.

By using the coupling mentioned above, the part of the transmitting output level of power amplifying apparatus 20 is taken from coupling capacitor 24, and then becomes a smoothed signal by detector 22 formed of built-in diode 23, load resistor 26 used for outside smoothing circuit 25 and smoothing capacitor 27. Consequently, the transmitting output level can be detected. On the other hand, directional coupler 28 is coupled with first terminating resistor 32, so that a signal of power amplifying apparatus 20 is not taken.

Figure 3:
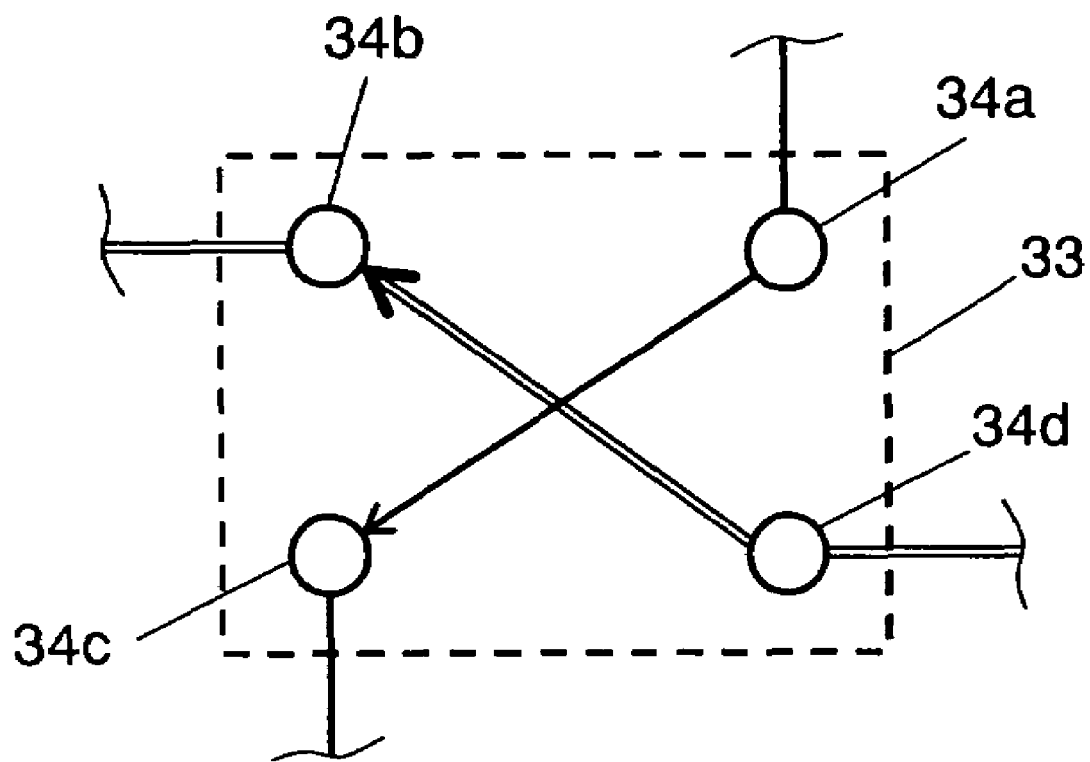
FIG. 3 shows another coupling state of the switch formed in the power amplifying apparatus in accordance with the first exemplary embodiment of the present invention.

FIG. 3 shows a coupling state of switch 33 in a case where the dynamic range of the signal is large. In FIG. 3, terminal 34d is coupled with terminal 34b, and terminal 34a is coupled with terminal 34c in switch 33.

By using the coupling mentioned above, the part of the transmitting output level of power amplifying apparatus 20 is taken from directional coupler 28, and then becomes a smoothed signal by detector 22 formed of built-in diode 23, load resistor 26 used for outside smoothing circuit 25 and smoothing capacitor 27. Consequently, the transmitting output signal level can be detected. On the other hand, coupling capacitor 24 is coupled with second terminating resistor 35, so that a signal of power amplifying apparatus 20 is not taken.

Figure 10:
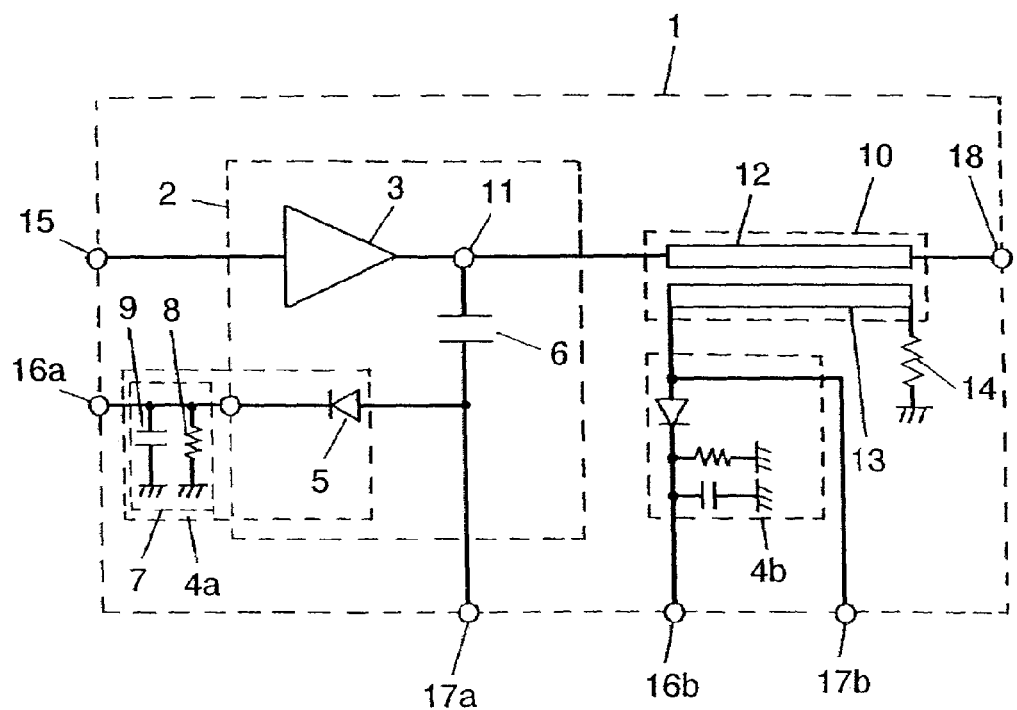
FIG. 10 is a block diagram showing a conventional transmitting output control circuit.

According to conventional transmitting output control circuit 1 in FIG. 10, when any dynamic range is needed, two detectors are required inside and outside power amplifying apparatus 20. However, according to transmitting output control circuit 19 of the present invention in FIG. 1, a detector becomes unnecessary at the outside of power amplifying apparatus 20 by forming switch 33, so that downsizing of the transmitting output control circuit can be realized.

Furthermore, by forming temperature compensating circuit 49 at base bias terminal 50 of power amplifying apparatus 20, a base bias voltage can be controlled with respect to variations in gain of power amplifier 21. Accordingly, even when an ambient temperature is changed, a transmitting signal can be output stably, and an accurate level can be detected.

Figure 4:
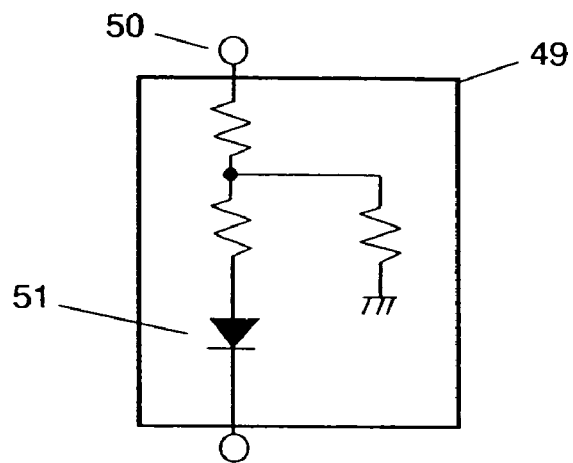
FIG. 4 is a block diagram showing a temperature compensating circuit using a second diode in the transmitting output control circuit in accordance with the first exemplary embodiment of the present invention.

FIG. 4 is a block diagram showing a temperature compensating circuit using a second diode in the transmitting output control circuit in accordance with the first exemplary embodiment of the present invention.

By using temperature dependence of a PN junction of second diode 51 formed in temperature compensating circuit 49, a compensatory function of a base bias voltage applied to base bias terminal 50 can be added with respect to variations in gain of power amplifier 21. Accordingly, even when an ambient temperature is changed, a transmitting signal can be output stably, and an accurate level can be detected.

Figure 5:
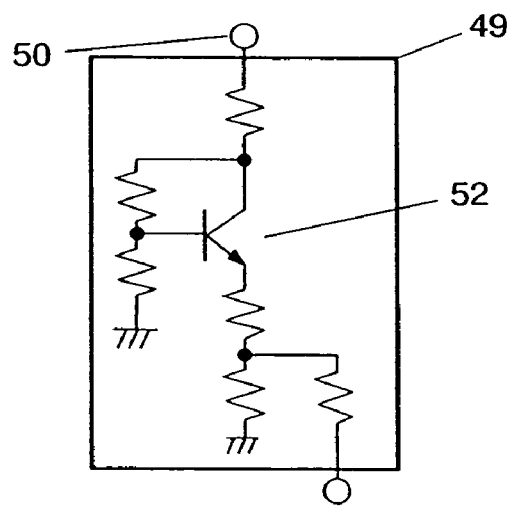
FIG. 5 is a block diagram showing a temperature compensating circuit using a bipolar transistor in the transmitting output control circuit in accordance with the first exemplary embodiment of the present invention.

Further, FIG. 5 is a block diagram showing a temperature compensating circuit using a bipolar transistor in the transmitting power control circuit in accordance with the first exemplary embodiment of the present invention. As shown in FIG. 5, by using temperature dependence of a PN junction of bipolar transistor 52 too, a compensatory function of a base bias voltage can be added.

Figure 6:
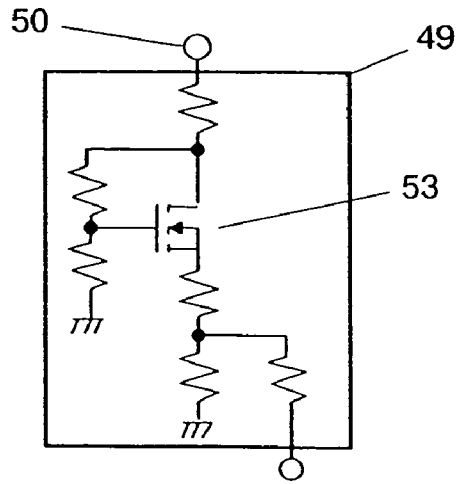
FIG. 6 is a block diagram showing a temperature compensating circuit using a MOSFET in the transmitting output control circuit in accordance with the first exemplary embodiment of the present invention.

Still further, FIG. 6 is a block diagram showing a temperature compensating circuit using a MOSFET in the transmitting power control circuit in accordance with the first exemplary embodiment of the present invention. As shown in FIG. 6, by using temperature dependence of a threshold voltage of MOSFET 53 too, a compensatory function of a base bias voltage can be added.

According to the present embodiment, second terminating resistor 35 is coupled with the outside of power amplifying apparatus 20, however, it may be built in power amplifying apparatus 20 as another example.

Second Exemplary Embodiment

The second exemplary embodiment of the present invention is demonstrated hereinafter with reference to the accompanying drawings.

Figure 7:
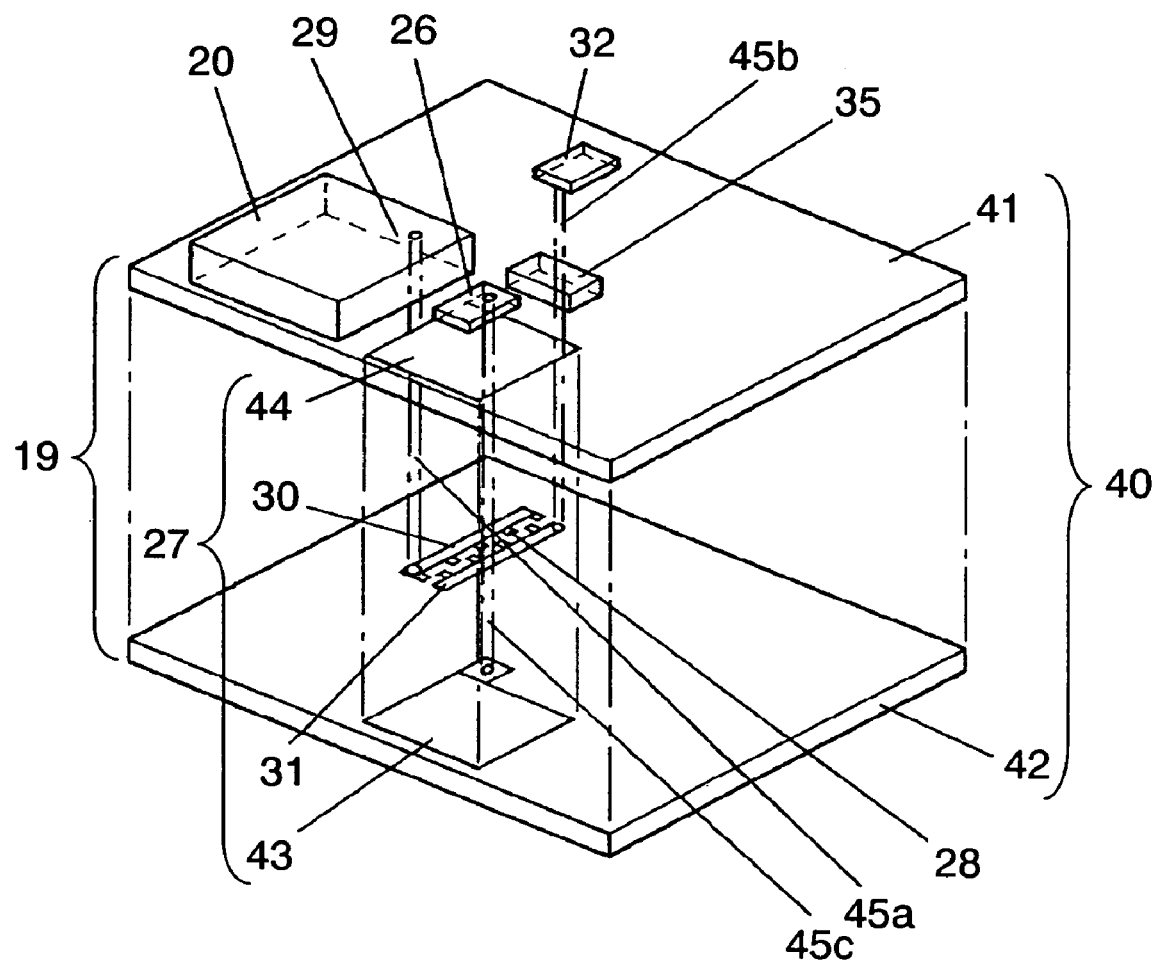
FIG. 7 is a perspective view of a transmitting output control circuit in accordance with the second exemplary embodiment of the present invention.
Figure 8:
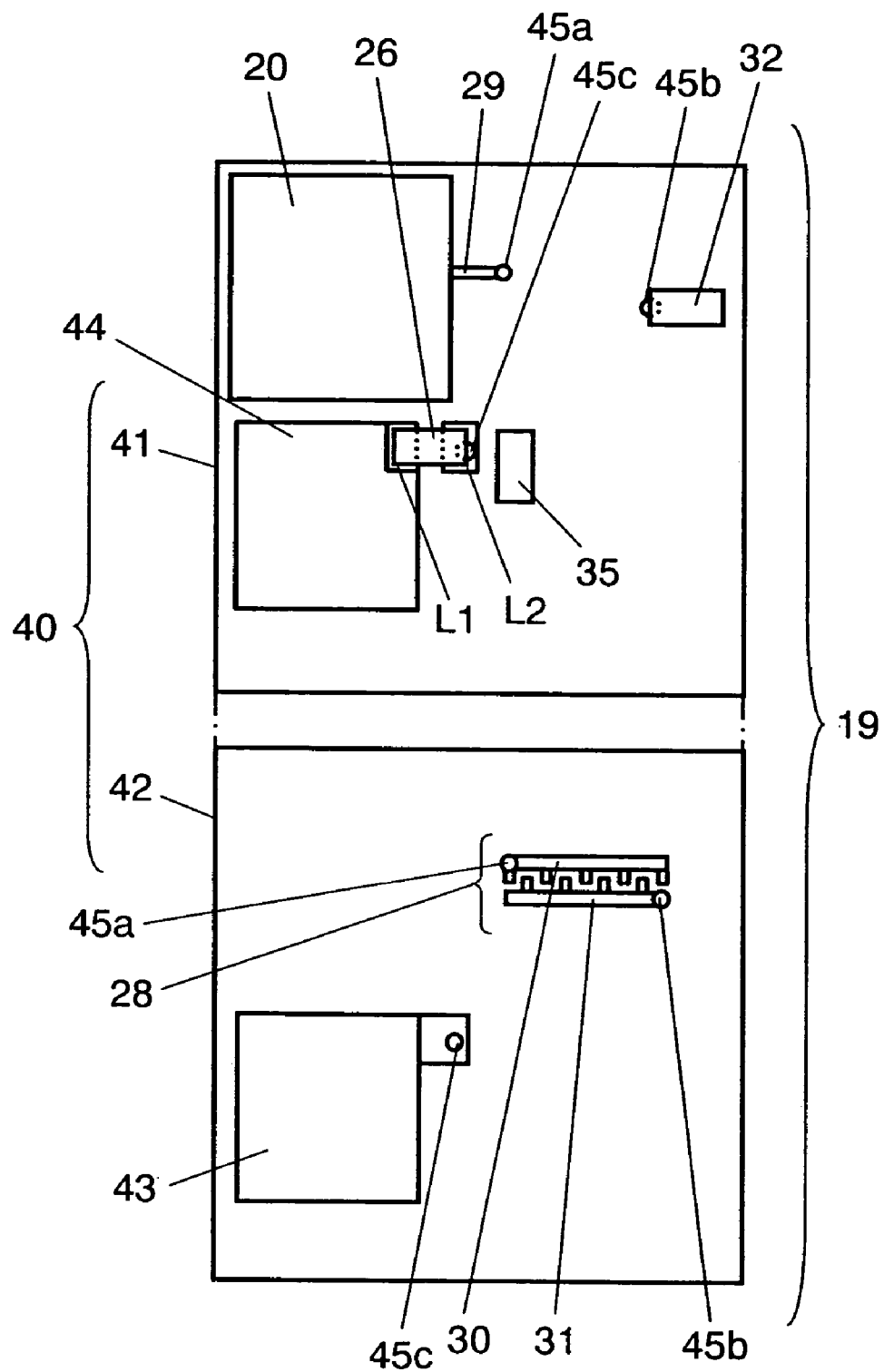
FIG. 8 is a plan view of a transmitting output control circuit in accordance with the second exemplary embodiment of the present invention.

FIG. 7 is a perspective view of transmitting output control circuit 19 in accordance with the second exemplary embodiment of the present invention. FIG. 8 shows a plan view of surface layer 41 and dielectric layer 42. In these drawings, the elements similar to those shown in the first exemplary embodiment have the same reference marks, and the descriptions of those elements are omitted here.

In transmitting output control circuit 19 of FIGS. 7 and 8, power amplifying apparatus 20, first terminating resistor 32, second terminating resistor 35 and load resistor 26 of a smoothing circuit are mounted on surface layer 41 of multilayer board 40, and directional coupler 28 is integrated into dielectric layer 42.

Main line 30 of directional coupler 28 is coupled with amplifier output terminal 29 through via hole 45a, and sub line 31 is coupled with first terminating resistor 32 through via hole 45b. By forming directional coupler 28 at dielectric layer 42 discussed above, a mounting area of transmitting output control circuit 19 can be reduced as compared with a case where it is formed at surface layer 41, thereby allowing downsizing of components.

Further, main line 30 and sub line 31 of directional coupler 28 are formed of comb-shaped stripline electrodes provided in dielectric layer 42. Using this structure, coupling quantity of directional coupler 28 is determined by capacitance generated between main line 30 and sub line 31. Therefore, large capacitance can be obtained as compared with a case where main line 30 and sub line 31 are formed of parallel lines, thereby allowing downsizing of directional coupler 28. The coupling quantity can be controlled in detail by increasing and decreasing the number of teeth of the comb.

Still further, ground electrode 44 is formed on an upper surface of surface layer 41, and land L1 for mounting load resistor 26 is formed thereon. Capacitor electrode 43 is formed on an upper surface of dielectric layer 42, and coupled with another land L2 for mounting load resistor 26 through via hole 45c. Using this structure, ground electrode 44 formed on surface layer 41 and capacitor electrode 43 formed on dielectric layer 42 face each other, thereby forming smoothing capacitor 27. As a result, the number of components of transmitting output control circuit 19 can be reduced because another smoothing capacitor does not need to be formed.

Yet further, land L1 for mounting load resistor 26 is formed in common with ground electrode 44 of smoothing capacitor 27, so that a mounting area of transmitting output control circuit 19 can be reduced.

Third Exemplary Embodiment

Figure 9:
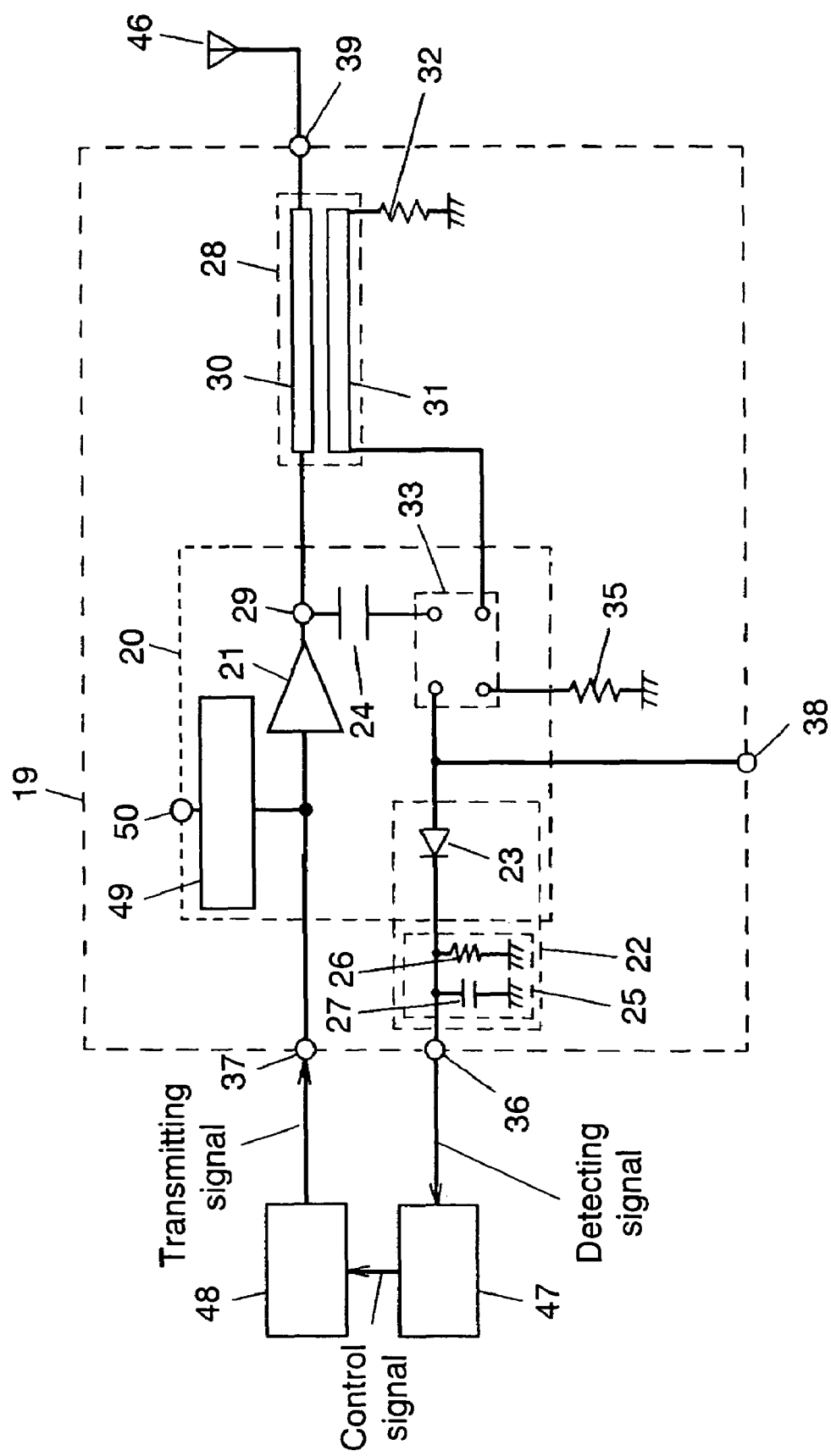
FIG. 9 is a block diagram showing a transmitter of a wireless device using a transmitting output control circuit in accordance with a third exemplary embodiment of the present invention.

The third exemplary embodiment of the present invention is demonstrated hereinafter with reference to the accompanying drawings. FIG. 9 is a block diagram showing a transmitter of a wireless device using a transmitting power control circuit of the present invention. In these drawings, the elements similar to those shown in the first exemplary embodiment have the same reference marks, and the descriptions of those elements are omitted here.

In FIG. 9, a part of a transmitting output signal level of power amplifying apparatus 20 is taken by coupling capacitor 24 and directional coupler 28. Switch 33 is switched so as to couple with coupling capacitor 24 or directional coupler 28 based on a dynamic range necessary for detecting a transmitting output signal level in the same manner as the first exemplary embodiment. The taken transmitting output signal level is changed into a smoothed detecting signal by smoothing capacitor 27 of smoothing circuit 25 in detector 22. This detecting signal is output from detecting output terminal 36, and changed into a controlling signal at controlling section 47 formed outside transmitting output control circuit 19. This controlling signal is input into transmitting section 48, and controlled in such a manner that a transmitting signal, which is output from transmitting section 48 to transmitting output control circuit 19, reaches a targeted level. As discussed above, transmitting output control circuit 19 forms a feedback loop for controlling the transmitting output signal level, and the transmitting output signal, which has reached the targeted level, is transmitted from signal output terminal 39 to antenna 46, so that the transmitting output control circuit functions as a transmitter of a wireless device.

Further, by using temperature compensating circuit 49, a compensatory function of a base bias voltage applied to base bias terminal 50 is added with respect to variations in gain of power amplifier 21 in the same manner as the first exemplary embodiment. As mentioned above, by making power amplifying apparatus 20 formed of power amplifier 21, first diode 23, coupling capacitor 24 and switch 33 into IC, compact power amplifying apparatus 20 having excellent characteristics can be constructed.

Still further, because the compact transmitting power control circuit having excellent characteristics is used in the transmitter of the wireless device discussed above, the compact wireless device having excellent characteristics can be realized.

INDUSTRIAL APPLICABILITY

The present invention has an advantage that a compact and stable transmitting power control circuit can be realized because it is operated by one detector irrespective of a scale of a dynamic range necessary for detecting a transmitting output signal level. Therefore it is useful for a transmitter or the like of a wireless device.

The invention claimed is:

1. A transmitting output control circuit comprising:
a power amplifying apparatus including:
  a power amplifier;
  a coupling capacitor for taking a part of a transmitting output signal of the power amplifier; and
  a first diode for inputting a signal corresponding to an output signal amplified by the power amplifier and generating a detecting signal;
a directional coupler having a main line and sub line;
a first terminating resistor coupled with one end of the sub line of the directional coupler;
a switch disposed in the power amplifying apparatus;
a second terminating resistor coupled with the switch; and
a smoothing circuit coupled with a cathode of the first diode,
wherein one end of the coupling capacitor and one end of the main line of the directional coupler are coupled with an output terminal of the power amplifier,
wherein the switch is further coupled with an other end of the coupling capacitor, an other end of the sub line of the directional coupler, and an anode of the first diode, and the switch has a first state in which said other end of the coupling capacitor is coupled with the anode of the first diode and said other end of the sub line of the directional coupler is coupled with the second terminating resistor, and a second state in which said other end of the coupling capacitor is coupled with the second terminating resistor and said other end of the sub line of the directional coupler is coupled with the anode of the first diode,
wherein the part of the transmitting output signal of the power amplifier is taken through one of the coupling capacitor and the directional coupler by switching the first state and the second state of the switch.

2. The transmitting output control circuit of claim 1,
wherein the power amplifying apparatus, the first terminating resistor, the second terminating resistor and a load resistor forming the smoothing circuit are mounted at a surface layer of a multilayer board,
wherein the directional coupler is mounted at a dielectric layer of the multilayer board.

3. The transmitting output control circuit of claim 2,
wherein the second terminating resistor is built in the power amplifying apparatus.

4. The transmitting output control circuit of claim 2,
wherein the main line and the sub line of the directional coupler are formed of comb-shaped stripline electrodes provided in the dielectric layer of the multilayer board.

5. The transmitting output control circuit of claim 2,
wherein the smoothing circuit is formed of a smoothing capacitor and the load resistor,
wherein the smoothing capacitor is formed in such a manner that a ground electrode on the surface layer of the multilayer board and a capacitor electrode on the dielectric layer of the multilayer board face each other across the dielectric layer,
wherein one end of the load resistor is coupled with the ground electrode, and an other end of the load resistor is coupled with the capacitor electrode through a via hole of the multilayer board.

6. The transmitting output control circuit of claim 1,
wherein the power amplifying apparatus further includes:
  a base bias terminal; and
  a temperature compensating circuit coupled with the base bias terminal,
wherein variation in gain of the power amplifier depending on variation in an ambient temperature of the power amplifier is compensated by controlling a base bias voltage applied to the base bias terminal.

7. The transmitting output control circuit of claim 6,
wherein the temperature compensating circuit includes a second diode.

8. The transmitting output control circuit of claim 6,
wherein the temperature compensating circuit includes a bipolar transistor.

9. The transmitting output control circuit of claim 6,
wherein the temperature compensating circuit includes a MOSFET.

10. The transmitting output control circuit of any one of claims 1-9,
wherein the power amplifying apparatus, which includes the power amplifier, the first diode, the coupling capacitor, the switch and the temperature compensating circuit, is made into IC.

11. A wireless device comprising:
a transmitting section;
a controlling section;
the transmitting output control circuit of any one of claims 1-9; and
an antenna.

* * * * *

UNITED STATES PATENT AND TRADEMARK OFFICE
CERTIFICATE OF CORRECTION

| | | |
|---|---|---|
| PATENT NO. | : 7,299,015 B2 | Page 1 of 1 |
| APPLICATION NO. | : 10/555463 | |
| DATED | : November 20, 2007 | |
| INVENTOR(S) | : Iwamiya et al. | |

It is certified that error appears in the above-identified patent and that said Letters Patent is hereby corrected as shown below:

On Title Page

On Page 2, item [56], References Cited, "JP 2001-140633 A" should read --JP 2004-140663 A--

Signed and Sealed this

Twentieth Day of May, 2008

JON W. DUDAS
*Director of the United States Patent and Trademark Office*